(12) United States Patent  
Kavalieros et al.

(10) Patent No.: US 7,465,976 B2
(45) Date of Patent: Dec. 16, 2008

(54) TUNNELING FIELD EFFECT TRANSISTOR USING ANGLED IMPLANTS FOR FORMING ASYMMETRIC SOURCE/DRAIN REGIONS

(75) Inventors: Jack T. Kavalieros, Portland, OR (US); Matthew V. Metz, Hillsboro, OR (US); Gilbert Dewey, Hillsboro, OR (US); Ben Jin, Lake Oswego, OR (US); Justin K. Brask, Portland, OR (US); Suman Datta, Beaverton, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 18 days.

(21) Appl. No.: 11/129,520

(22) Filed: May 13, 2005

(65) Prior Publication Data

US 2006/0258072 A1    Nov. 16, 2006

(51) Int. Cl.
*H01L 29/76* (2006.01)
(52) U.S. Cl. .............. 257/213; 257/288; 257/196; 257/310; 257/E21.438; 257/E21.637; 257/E21.639; 257/E21.703; 257/E27.112; 257/E29.255

(58) Field of Classification Search ............... 257/288, 257/27, 69, 133, 134, 192, 196, 200, 310, 257/377, 401, 411, 213, 350, 346
See application file for complete search history.

(56) References Cited

U.S. PATENT DOCUMENTS

| | | | | |
|---|---|---|---|---|
| 4,583,105 A | * | 4/1986 | Rosenberg | 257/192 |
| 4,675,711 A | * | 6/1987 | Harder et al. | 257/27 |
| 6,214,679 B1 | * | 4/2001 | Murthy et al. | 438/299 |
| 6,797,983 B2 | * | 9/2004 | Chen et al. | 257/59 |
| 6,887,762 B1 | * | 5/2005 | Murthy et al. | 438/300 |
| 6,949,482 B2 | * | 9/2005 | Murthy et al. | 438/933 |
| 6,995,054 B2 | * | 2/2006 | Oda et al. | 438/197 |
| 7,026,232 B1 | * | 4/2006 | Koontz et al. | 438/589 |
| 2003/0143768 A1 | * | 7/2003 | Chen et al. | 438/30 |
| 2005/0285213 A1 | * | 12/2005 | Datta et al. | 257/411 |

* cited by examiner

*Primary Examiner*—David Nhu
(74) *Attorney, Agent, or Firm*—Blakely, Sokoloff, Taylor & Zafman LLP

(57) ABSTRACT

The present invention relates to a Tunnel Field Effect Transistor (TFET), which utilizes angle implantation and amorphization to form asymmetric source and drain regions. The IFET further includes a silicon germanium alloy epitaxial source region with a conductivity opposite that of the drain.

11 Claims, 5 Drawing Sheets

TUNNELING FIELD EFFECT TRANSISTOR USING ANGLED IMPLANTS FOR FORMING ASYMMETRIC SOURCE/DRAIN REGIONS

BACKGROUND

1. Field

The present invention relates to the field of semiconductor manufacturing, specifically a planar Tunneling Field Effect Transistor (TFET) which features asymmetric source/drain terminals and a silicon germanium alloy epitaxial source region.

2. Description of Related Art

As MOSFET gate length scaling continues, controlling short channel effects such as drain induced barrier lowering and sub-threshold swing is imperative for improved performance. Tunnel Field Effect Transistors (TFET's) can improve both of these parameters by changing the injection mechanism and provide asymmetric doping to the source and drain regions of the device. Asymmetric processing has limited the prior TFET fabrication attempts to vertical growth of the source, channel, and drain regions, requiring a side gate oxide and gate electrode deposition. This process suffers from high overlap capacitance between the gate and source/drain regions which adversely increases the transistor gate delay and limits the device to a single channel length. The TFET also suffers from high gate leakage due to the oppositely biased source and gate nodes.

In a conventional MOSFET, sub-threshold swing is limited by the diffusion of carriers over the source to channel barrier where the injection current is proportional to kT/q; hence at room temperature, 25 C., sub-threshold swing is 60 mV/dec. In a TFET, injection is governed by band to band tunneling from the valence band of the source to the conduction band of the channel which can achieve much lower sub-threshold swing. DIBL and off-state leakage, other short channel affects, are limited by the n vs. p doping asymmetry of the source to drain.

DETAILED DESCRIPTION OF INVENTION

In an embodiment, the present invention includes a planar Tunneling Field Effect Transistor (TFET) comprising asymmetric transistor terminals, an epitaxial grown source region, and multiple transistor gate lengths. In an embodiment, the planar TFET is n-type, which features a p-type silicon germanium alloy epitaxial source region and a silicon drain region with an $N^+$ type conductivity. The planar TFET of the present invention may be manufactured p-type. In an embodiment, this asymmetry is achieved by a shadowing technique provided by both a properly-size, patterned gate stack and angled implants. Planar TFET's are advantageous because short channel effects, such as drain induced barrier lowering (DIBL) and sub-threshold swing (ΔS), caused by progressive gate length scaling, are improved without performance limiters attributable to vertical TFET's. To increase performance, an embodiment utilizes a high-k gate dielectric to remedy the effect of gate tunneling leakage due to dual gate/source biasing at $V_{cc}$ and $-V_{cc}$ in the "on state."

Figure 1:
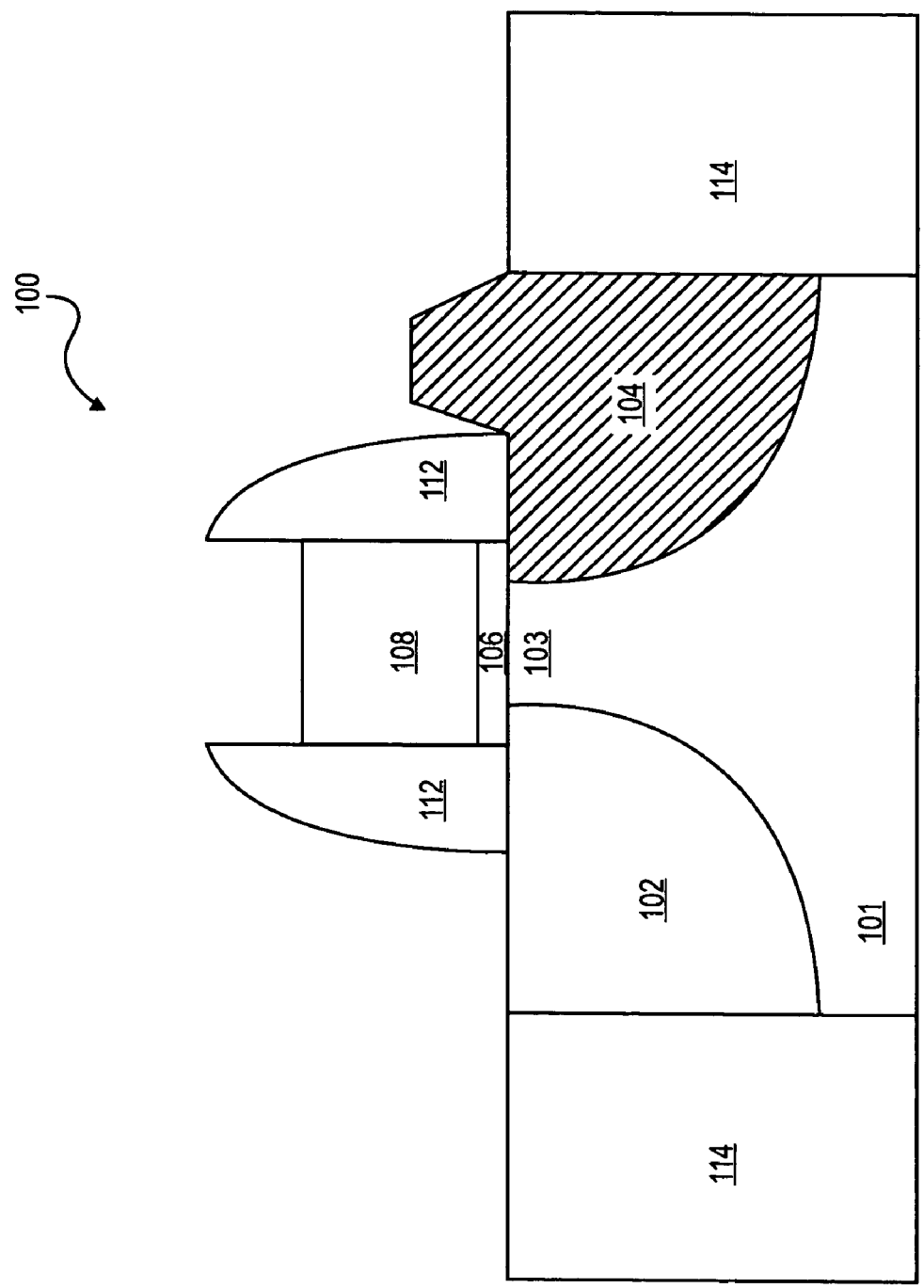
FIG. 1 is an illustration of TFET 100 according to an embodiment of the present invention.
Figure 2:
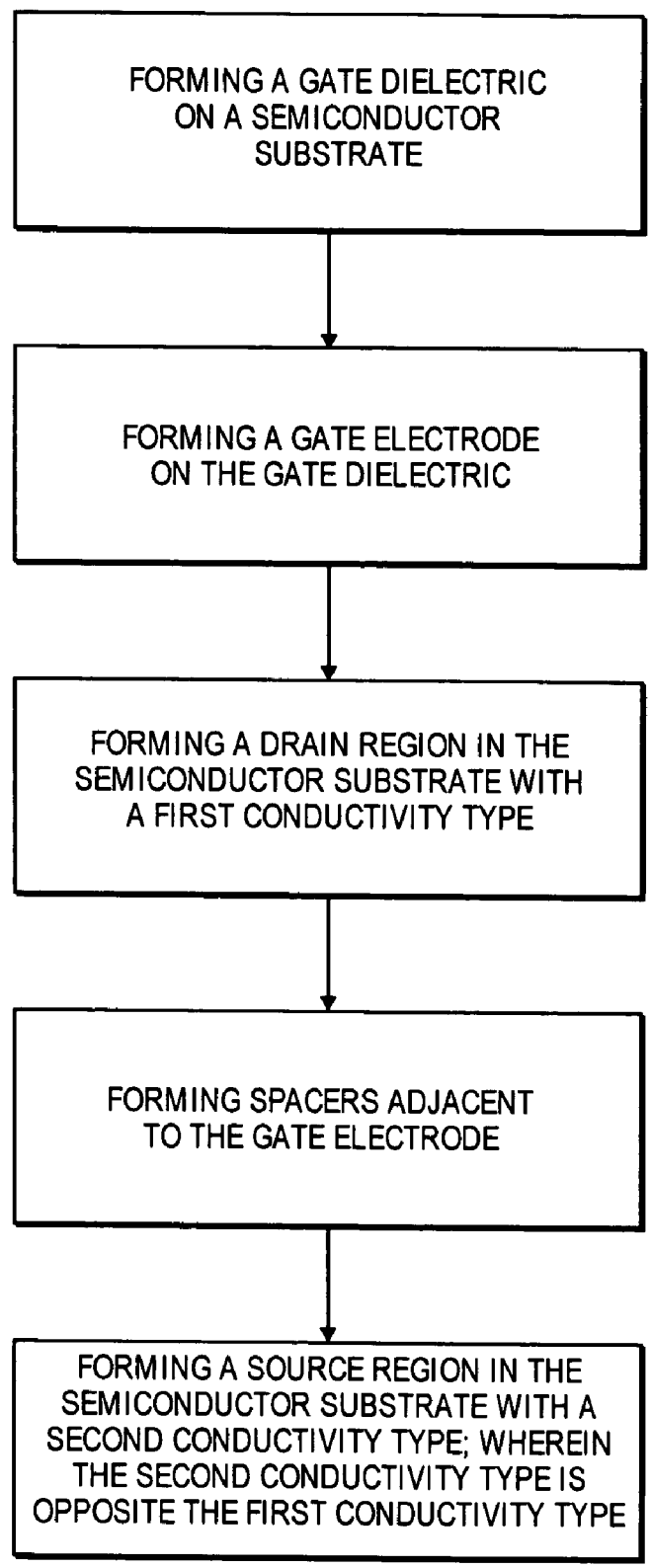
FIG. 2 is a flowchart of an embodiment for manufacturing the TFET of the present invention.

FIG. 1 is a cross-sectional illustration of TFET 100 in accordance with an embodiment of the present invention. As shown, TFET 100 contains conventional semiconductor device features: semiconductor substrate 101, gate dielectric 106, gate electrode 108, spacers 112, and shallow trenches 114. Also illustrated in FIG. 1, TFET 100 features asymmetric drain region 102 and source region 104 having opposite conductivities. As illustrated in FIG. 1, TFET 100 is planar, thus provides a lateral layout of source, gate, and drain terminals, whereby the source and drain terminals are formed in semiconductor substrate 101. In an embodiment, source region 104 may be raised above the surface of the semiconductor substrate as illustrated in FIG. 1.

In an embodiment of the present invention, TFET 100 features a patterned gate dielectric 106 and gate electrode 108, which individually serve specific device functions commonly known in the art. In an embodiment, gate dielectric 106 is located above channel 103, located below gate electrode 108, and between spacers 112. In an embodiment, gate dielectric 106 is comprised of silicon dioxide. Gate dielectric 106 may also be a high-k gate dielectric. High-k dielectrics typically have a dielectric constant, k, greater than 7. For example, gate dielectric 106 may be comprised of hafnium oxide, tantalum pentaoxide, titanium oxide, zirconium oxide, aluminum oxide, or other high-k dielectric materials. In an embodiment, gate electrode 108 is located above gate dielectric 106 and between spacers 112. In an embodiment, gate electrode 108 comprises doped polysilicon. Gate electrode 108 may also comprise metal. For example, gate electrode may be comprised of tungsten titanium-nitride alloys, tantalum, tantalum nitride, titanium nitride, or other metal gate electrode materials.

Drain region 102 serves the conventional function of injecting carriers out of a field effect transistor (FET), as commonly known in the art. In an embodiment, drain region 102 is located in semiconductor substrate 101 between shallow trench 114 and channel 103 and below spacers 112 and gate dielectric 106. In an embodiment of the present invention, drain region 102 is doped N+ with conductivity between $10^{19}$ atoms/cm and $10^{21}$ atoms/cm. In an embodiment, the concentration of N+ dopants in drain region 102 is $10^{21}$ atoms/cm$^3$.

Source region 104 serves the conventional function of carrying carriers into the channel region of a field effect transistor (FET), as commonly known in the art. In an embodiment, source region 104 is located between shallow trench 114 and channel 103 and on the opposite side of channel region 103 than drain region 102. Conventionally, the source and drain terminals of a FET have the same conductivities. However, in an embodiment the source and drain terminals have opposite conductivities. For example, in an embodiment, drain region 102 is doped to an N+ conductivity and the conductivities of source region 104 is doped p-type. In an embodiment, source region 104 is formed of a silicon germanium alloy epitaxial layer. The epitaxial layer can be doped between $10^{18}$-$10^{21}$ atoms/cm$^3$. In an embodiment, the epitaxial layer is in situ doped to $10^{19}$ atoms/cm$^3$ with p-type dopants. Germanium may comprise between 5-50% of the silicon germanium alloy epitaxial layer, which serves to offset the valence band on the source side relative to the silicon by lowering the height of the energy barrier. Source region 104 may extend above the surface of semiconductor substrate 101 as illustrated by the raised source region 104 in FIG. 1.

Channel region 103 serves the conventional function of allowing carriers to flow from the source to the drain in field effect transistors (FET), as commonly known in the art. In an embodiment, channel region 103 has the same conductivities as drain region 102, but has the opposite conductivity than source region 104. For example, if drain region 102 and source region 104 is doped with an n-type and p-type conductivity respectfully, then channel region 103 is doped with an n-type conductivity. In an embodiment, channel region 103 is lightly doped n⁻. Thus, the concentration of channel region 103 may range from undoped, intrinsic mono-crystalline silicon to $10^{16}$ atoms/cm³. In an embodiment as illustrated in FIG. 1, channel region 103 is lightly doped n-type to a conductivity of $10^{16}$ atoms/cm³. In an embodiment, channel region 103 is formed in semiconductor substrate 101 and located between drain region 102 and source region 104 and beneath gate dielectric 106.

Figure 4A:
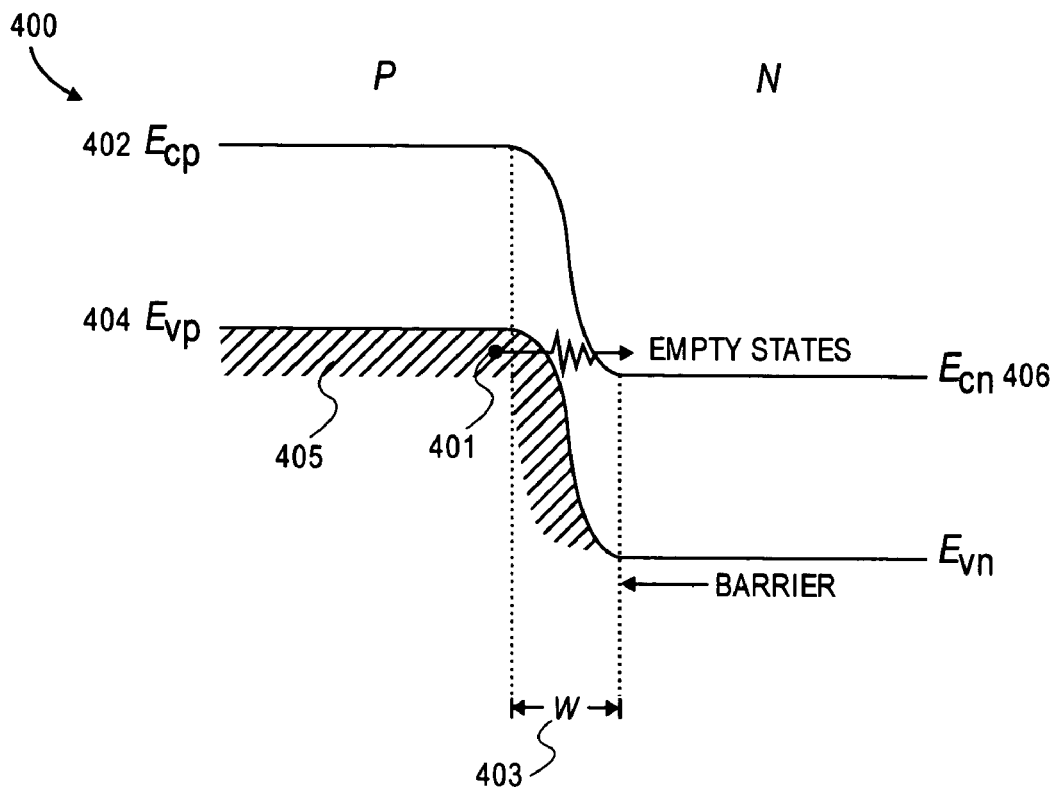
FIG. 4A is a diagram of tunneling in a reverse biased pn junction diode.

In an embodiment, turning on TFET 100 is a function of both reverse biasing and the energy gap delta (Ecp-Evp)-(Ecn-Evn). In an embodiment, reverse biasing TFET 100 consists of applying a negative voltage on the p-type source terminal, a positive voltage on the n-type drain, and a positive gate voltage on gate electrode 108. In this embodiment, TFET 100 has an n-type silicon channel and a p-type silicon germanium alloy source which makes up the reverse-biased diode. Tunneling in a reverse-biased diode, commonly known in the art as zener processing, is illustrated by the tunneling in reverse-biased pn junction diode diagram 400 in FIG. 4A. As known, tunneling in reverse-biased diodes involve p-side valence band electrons passing through an energy barrier to empty states at the same energy in the conduction band on the n-side. In FIG. 4A, tunneling electron 401, located among filled states 405 near the p-side valence bond 404, tunnels barrier 403 to n-side conduction band 406. The energy gap delta (Ecp-Evp)-(Ecn-Evn) also contributes to tunneling in TFET 100. The greater the gap energy delta, the more reverse-biasing needed to turn on the device. Conversely, a lesser energy gap delta requires less reverse-biasing needed to turn on the device Without tunneling, tunneling electron 401 can only reach n-side conduction band 406 by gaining enough energy to reach p-side conduction band 402. The number of electrons which tunnels through barrier 403 is a function of the energy gap delta and amount of reverse biasing.

Figure 4B:
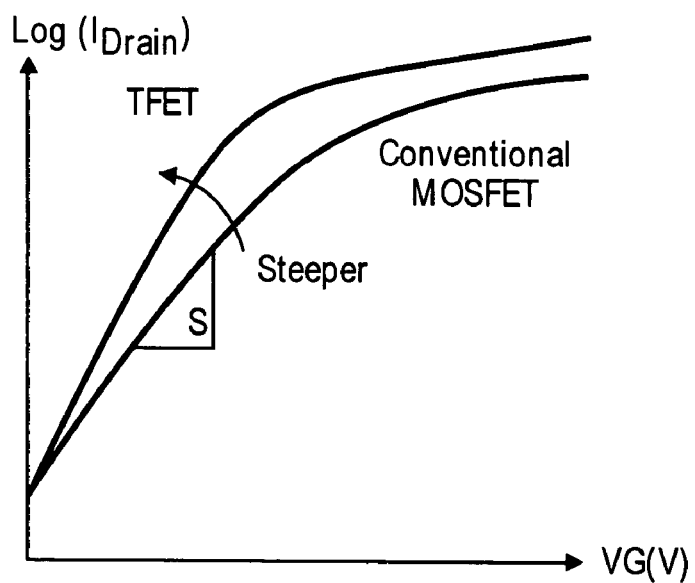
FIG. 4B is a diagram of a current-voltage characteristic under reverse bias.

A benefit TFET 100 provides is faster "turn on" or steeper subthreshold swing, ΔS (mV/decade of current) in the current-voltage characteristics shown in FIG. 4B. In the "on condition", of a conventional MOSFET the theoretical limit to turn on a device is ΔS=60 mV/dec. However, according to an embodiment of the present invention, TFET 100 can turn on at 30 mV/dec. In an embodiment, a high-k dielectric is used to reduce the gate leakage of TFET 100 due to dual source and gate terminal biasing.

In an embodiment of the present invention, TFET 100 may be manufactured by any suitable process such that source region 104 and drain region 102 are asymmetric. In an embodiment, TFET 100 is formed by the process illustrated in FIGS. 3A-3H.

Figure 3A:
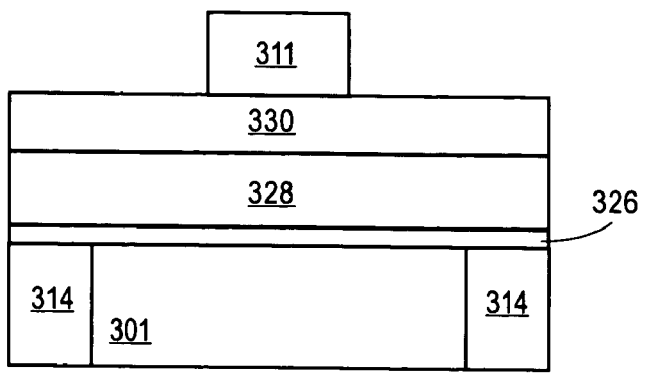
FIGS. 3A-3H are illustrations of an embodiment for manufacturing a TFET of the present invention.

To manufacture TFET 100 according to an embodiment as illustrated in FIG. 3A, first semiconductor substrate 301 is provided whereby shallow trenches 314 are formed by shallow trench isolation, Local Oxidation of Silicon (LOCOS), or other suitable processes known in the art. In an embodiment, gate dielectric layer 326 is formed on semiconductor substrate 301. Gate dielectric layer 326 may be formed by oxidation, CVD, ALD, or other methods known in the art. The thickness of gate dielectric layer 326 may be formed to a thickness varying from 10-50 angstroms. Next, gate electrode layer 328 is formed on gate dielectric layer 326 with a thickness range of 500-2000 angstroms. In an embodiment, gate electrode layer 328 comprises polysilicon and is formed by a CVD process. Hard mask layer 330 is subsequently formed on gate electrode layer 328 to a thickness in the range from 100-1000 angstroms and may be formed by a CVD process or other methods known in the art. In an embodiment as illustrated in FIG. 3A, patterned resist layer 311 is formed on hard mask layer 330 for subsequent patterning of the aforementioned layers.

Figure 3B:
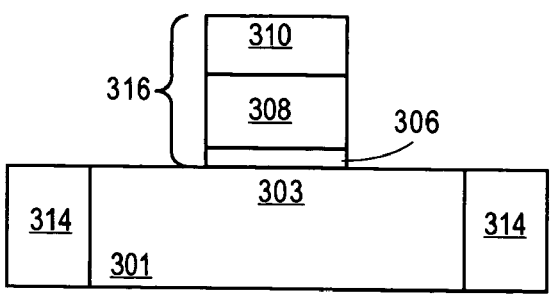

Gate dielectric layer 326, gate electrode layer 328, and hard mask 330 are subsequently patterned by methods common in the art to form gate dielectric 306, gate electrode 308, and hard mask 310 as illustrated in FIG. 3B. Gate dielectric 306, gate electrode 308, and hard mask 310 perform specific device and process functions common in the art, but in an embodiment serve collectively to create shadowing effects.

In an embodiment, gate dielectric 306, gate electrode 308, and hard mask 310 collectively function as a tower, gate tower 316, capable of creating shadowing effects to allow implanting and amorphizing in designated areas. The functionality of the shadowing effect is attributed to the height of gate tower 316 and the angle of the implanted species. Therefore, the height of gate tower 316 may vary and can be formed to fit device, implanting, amorphizing, and other process constraints.

In an embodiment, gate tower 316 comprises a sacrificial or dummy layer formed sufficient to create shadowing during angle implanting and shadowing. For example, a replacement process may be used whereby a sacrificial or dummy layer is formed in the location of gate dielectric 306, gate electrode 308, and hard mask 310. While the sacrificial or dummy layer is in the location of gate dielectric 306, gate electrode 308, and hard mask 310, shadowing can occur to prevent implanting or amorphizing from non-designated areas. Later, the sacrificial or dummy layer is removed and gate dielectric 306, gate electrode 308, and/or hard mask 310 is subsequently formed.

The angle of the implanted or amorphizing species is also relevant to create the shadowing function provided by gate tower 316. The angle of implanting, implanting angle 313, or amorphizing, amorphizing angle 315, is typically between 30-60° which allows a feasible range in relation to the height of gate tower 316 to effectuate shadowing. Implanting angle 313 and amorphizing angle 315 are measured by an axis parallel to the top surface of semiconductor substrate 301. Effective shadowing does not require that none of the implanted or amorphizing dopants reach non-designated areas. As long as incidental implanting or amorphizing of non-designated areas are negligible, device functionality should not be substantially affected. For example, incidental doping of amorphizing dopants in the drain region during source amorphization should not have a substantial affect on the device functionality of the drain.

Figure 3C:
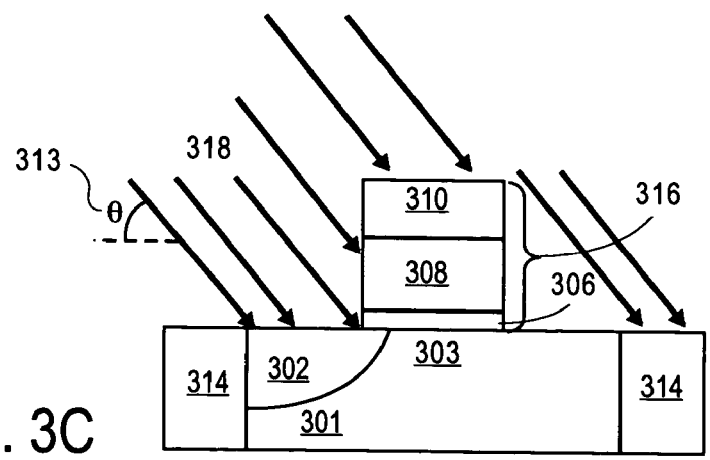

Next, drain region 302 is formed by angle implanting dopants 303 into semiconductor substrate 301 in the drain region location as illustrated in FIG. 3C. Dopants 318 such as arsenic and phosphorous may be used to dope drain region 302 to an N+ conductivities. Drain region 302 may be doped by any suitable technique such as implantation. In an embodiment, angled implanting is used to dope drain region 302. The implants are directed at semiconductor substrate 301 such that doping is achieved in drain region 302, but inhibited by gate tower 316 from doping later formed source region. In an embodiment, dopants 318 are chosen to form an N+ tip and drain region 302. In an embodiment, tip and drain region 302, are doped to a concentration of $10^{19}$ atoms/cm$^3$ and $10^{21}$ atoms/cm$^3$ respectively. In an embodiment, TFET 100 is not annealed post doping drain region 302 to maintain a dopant, saturated drain region 302 surface useful in subsequent selective deposition of source region 304.

While implanting dopants at an angle can be used to dope drain region 302, an embodiment uses angled implants to dope gate electrode 308. For example, N+ dopants are directed at an angle to dope drain region 302, but may also reach gate electrode 308. To ensure adequate doping, dopants 318 are later diffused throughout gate electrode 308 by an anneal step. However, gate electrode 308 may be in situ doped and therefore subsequent doping is not required.

Figure 3D:
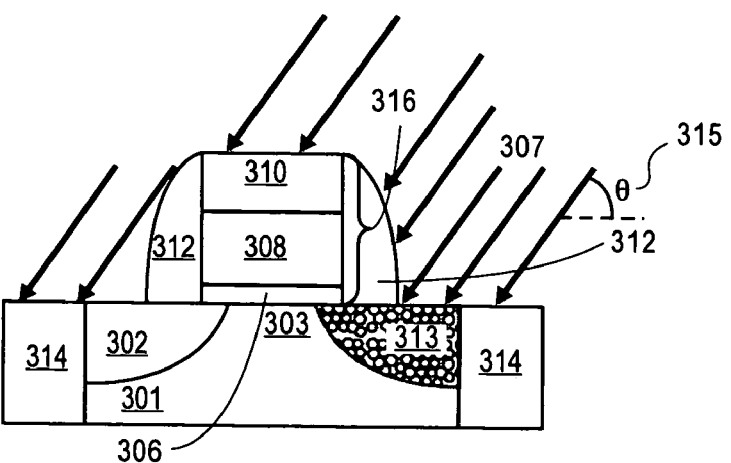

Next, spacers 312 are formed adjacent to both lateral sides of gate tower 316 as illustrated in FIG. 3D. Spacers 312 may be formed by a CVD process or any other method common in the art. Spacers 312 serve conventional functions of insulating the gate electrode from the source and drain regions and reducing the effects of Miller capacitance. In an embodiment, spacers 312 help encapsulate gate electrode 308 during amorphization of the source region location.

Next, the source region location is amorphized by amorphizing implants as illustrated in FIG. 3D. Amorphizing implants 307 are directed at TFET 100 at an angle to form amorphous source region 313. The amorphizing species chosen should be suitable to amorphize the source region location. Examples of suitable amorphizing species are silicon and germanium. After amorphization, the atomic arrangement of amorphous source region 313 is different than that of drain region 302. The resulting atomic arrangement of amorphous source region 313 is amorphous and the atomic arrangement of drain region 302 remains mono-crystalline silicon. Gate tower 316 effectively shadows amorphizing implants 307 from drain region 302 such that amorphization of drain region 302 is negligible. Thus, the device functionality of drain region 302 remains intact.

Figure 3E:
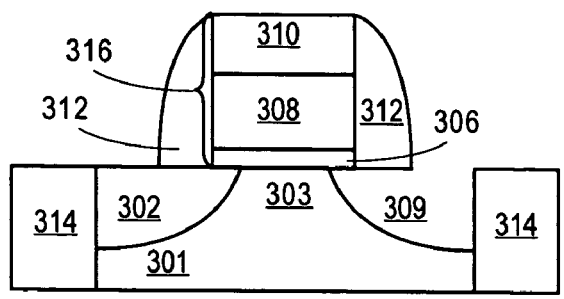

After amorphization, the source region location is selectively etched to form recess 309 in semiconductor substrate 301 as illustrated in FIG. 3E. Selectively etching the source region location involves etching the amorphous regions without etching the mono-crystalline silicon regions of semiconductor substrate 301. Recess 309 is formed in semiconductor substrate 301 between channel region 303 and shallow trench 314. Any etchant suitable to attack only amorphous silicon may be used. In an embodiment, a tri-acidic mixture of hydrofluoric, acetic, and nitric acid is used to selectively etch amorphous source region 313 without causing substantial damage to the mono-crystalline silicon regions of semiconductor substrate 301. In an embodiment, semiconductor substrate 301 is selectively etched whereby recess 309 is formed in the top 50-1000 angstroms of semiconductor substrate 301.

Figure 3F:
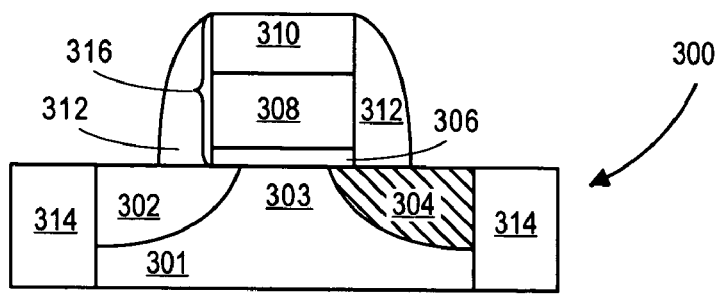

After selectively etching the source region location to form recess 309, a source material is formed in recess 309 to define source region 304 as illustrated in FIG. 3F. The source material should be suitable to create band bending with respect to channel region 303. For example, a silicon germanium alloy epitaxial layer is selectively grown in recess 309 when channel region 303 comprises doped mono-crystalline silicon. In an embodiment, the epitaxial layer is not grown in the silicon portion of drain region 302 due to the high doping concentration of drain region 302. In an embodiment, the doping concentration of drain region 302 is $10^{21}$ atoms/cm$^3$, which is sufficient to prevent substantial epitaxial growth. Therefore, an epitaxy layer is grown in the source region location of semiconductor substrate 301 to form source region 304. In an embodiment, the epitaxy layer is grown in order to fill recess 309 of semiconductor substrate 301. In an embodiment, the epitaxy layer is in situ doped with a p-type conductivity. In situ doped means in this context that the epitaxy layer is pre-doped and does not subsequent doping after it is grown in recess 309. However, the epitaxy layer grown in recess 309 does not need to be in situ doped and can therefore be doped after it is formed in recess 309.

Other methods may be used to selectively grow a source material in recess 309 to form source region 304. In an embodiment, drain region 302 may be amorphized such that the atomic arrangement of drain region 302 and the surface of recess 309 are different. After amorphizing drain region 302, a source material can be selectively grown or deposited in non-amorphous regions of the substrate to form source region 304.

Figure 3G:
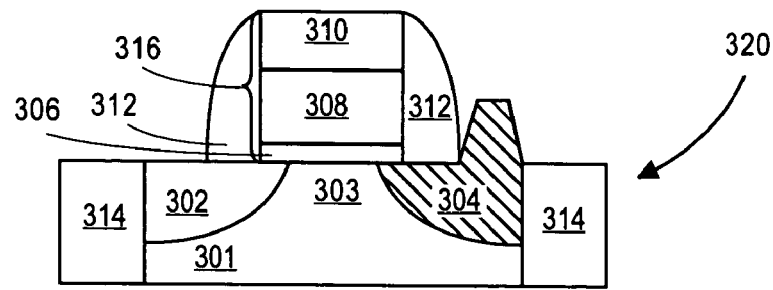
Figure 3H:
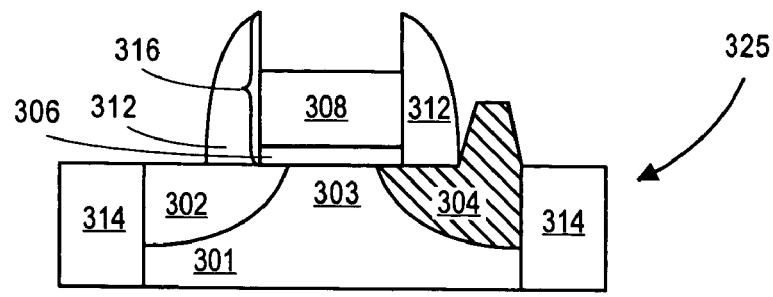

Source region 304 may be formed to extend above the surface of semiconductor substrate 301 as illustrated by TFET 320 in FIG. 3G. In an embodiment, hard mask 310 may be removed as illustrated by TFET 325 in FIG. 3H for subsequent processing. In an embodiment, drain region 302 is annealed to drive in dopants 318 to their effective device location within semiconductor substrate 301.

The invention claimed is:

1. A tunneling field effect transistor formed on a semiconductor substrate comprising:
   a gate dielectric on said semiconductor substrate;
   a gate electrode above said gate dielectric;
   a pair of spacers adjacent to said gate dielectric and said gate electrode
   a source region and a drain region on opposing sides of said gate electrode, said source region formed of a different material than said drain region;
   wherein said source region has a first conductivity and said drain region has a second conductivity and wherein said first conductivity is opposite said second conductivity.

2. The tunneling field effect transistor of claim 1, wherein said semiconductor substrate comprises silicon.

3. The tunneling field effect transistor of claim 1, wherein said gate dielectric is a high-k gate dielectric.

4. The tunneling field effect transistor of claim 1, wherein said semiconductor device has a channel region formed in said semiconductor substrate and said source region is formed of a material sufficient to create energy band bending.

5. The tunneling field effect transistor of claim 1, wherein said first conductivity is p-type.

6. A tunneling field effect transistor formed on a silicon substrate comprising:
   a high-k gate dielectric on said silicon film;
   a gate electrode above said high-k gate dielectric;
   a pair of spacers adjacent to said high-k gate dielectric and said gate electrode;
   a source region on one side of said gate electrode and a drain region on the opposing side of said gate electrode than said source region, wherein said source region is formed of a different material than said drain region;
   wherein said drain region has a first conductivity and said source region has a second conductivity;
   wherein said first conductivity is opposite said second conductivity.

7. The tunneling field effect transistor of claim 6, wherein the second conductivity is p-type.

8. A tunneling field effect transistor formed on a semiconductor substrate comprising:
   a channel region in the semiconductor substrate;
   a gate electrode above the gate dielectric;
   a pair of spacers adjacent to the gate dielectric and the gate electrode;

a source region and a drain region on opposing sides of the gate electrode, wherein the source region is formed of a material sufficient to create energy band bending, and the source region is formed of a different material than the drain region;

wherein the source region has a first conductively and the drain region has a second conductivity, and wherein the first conductivity is opposite the second conductivity.

9. The tunneling field effect transistor of claim 8, wherein the gate dielectric is a high-k gate dielectric.

10. The tunneling field effect transistor of claim 8, wherein the source region comprises a silicon germanium alloy.

11. The tunneling field effect transistor of claim 8, wherein the first conductivity is p-type.

* * * * *